(12) United States Patent
Liu et al.

(10) Patent No.: US 6,242,961 B1
(45) Date of Patent: Jun. 5, 2001

(54) METHODS AND CIRCUITS FOR RESTORATION OF A DROOPED DC SIGNAL

(75) Inventors: James Liu; Wen Fang, both of San Jose; Wen-Chung Wu, Cupertino, all of CA (US)

(73) Assignee: Altima Communication, Inc., Irvine, CA (US)

( * ) Notice: Subject to any disclaimer, the term of this patent is extended or adjusted under 35 U.S.C. 154(b) by 0 days.

(21) Appl. No.: 09/415,680

(22) Filed: Oct. 8, 1999

Related U.S. Application Data

(60) Provisional application No. 60/103,687, filed on Oct. 8, 1998.

(51) Int. Cl.[7] ............................. H03L 5/00; H03K 5/01

(52) U.S. Cl. .......................... 327/307; 327/99; 327/141; 327/165; 327/168

(58) Field of Search ........................... 327/99, 307, 165, 327/141, 306, 168

(56) References Cited

U.S. PATENT DOCUMENTS 5,122,677 * 6/1992 Sato ......................................... 327/99

* cited by examiner

*Primary Examiner*—Dinh T. Le
(74) *Attorney, Agent, or Firm*—Arent Fox Kintner Plotkin & Kahn, PLLC

(57) ABSTRACT

Circuits for the restoration of a drooped signal are disclosed. In the asynchronous mode circuit, the drooped signal can be restored by detecting the peak of the positive amplitude and the peak of the negative amplitude and take the difference between the two peaks. This difference signal is fed back the equalizer. In the synchronous mode circuit, the drooped signal is sliced and passed to a regeneration circuit. The regeneration circuit uses reference voltage signals and phase information from the slicer to generate a regenerated signal. The regenerated signal is compared with the equalized signal to generate a difference signal, again fed back to the equalizer. The sliced signal is also fed to a clock recovery circuit which recovers the clock signal embedded in the received signal. The two circuits can be combined to provide an optimal circuit for the restoration of a drooped signal.

3 Claims, 4 Drawing Sheets

METHODS AND CIRCUITS FOR RESTORATION OF A DROOPED DC SIGNAL

PRIORITY CLAIM

This application claims priority to a provisional application entitled "Zero-Forcing DC-Restoration" filed on Oct. 8, 1998, having an application Ser. No. 60/103,687.

BACKGROUND OF THE INVENTION

1. Field of the Invention

The present invention generally relates to methods and circuits for restoring a drooped DC signal, and, in particular, methods and circuits for restoring a drooped DC signal using both asynchronous and synchronous methods.

2. Description of the Prior Art

A DC signal may have both positive and negative amplitudes. As a DC signal travels from a transmitter to a receiver via a long medium (such as a cable), if the DC signal is not balanced, the signal will droop as it travels through a transformer. This situation is also know as base-line wander. For example, referring to FIG. 1a, a transmitter 10 is connected to a transformer 15 and out to a cable 14. On the other end of the cable 14, there is another transformer 17 connected to a receiver. Drooping occurs after both transformers. At node A 16, a point near the transmitter 10, as is illustrated by FIG. 1b, there is almost no drooping. After passing through the transformers, 15 and 17, at a point near the receiver 12, node B 18, there may be significant dropping as is illustrated by FIG. 1c. Note that the illustrated signal waveforms are MLT3 signals used in network protocols. The present invention as is disclosed below is not limited to MLT3 signals.

In a drooping situation, both the positive amplitude and the negative amplitude drifts toward zero volt. In order to properly process the received signal, a receiver should restore the signal before further processing the signal. Otherwise, the equalizer cannot generate the correct results. Therefore, it is desirable to have methods and circuit for restoration of a drooped signal.

SUMMARY OF THE INVENTION

It is therefore an object of the present invention to provide methods and circuits for restoring a drooped signal.

It is another object of the present invention to provide methods and circuits asynchronous restoration of a drooped signal.

It is yet another object of the present invention to provide methods and circuits synchronous restoration of a drooped signal.

It is still another object of the present invention to provide methods and circuits for restoration of a drooped signal using both asynchronous and synchronous methods.

Briefly, the present invention in one embodiment discloses a circuit for the restoration of a drooped signal. In the asynchronous mode, the drooped signal can be restored by detecting the peak of the received signal and the peak of the inverted received signal and take the difference between the two peaks. This difference signal is fed back the equalizer. In the synchronous mode, the drooped signal is sliced and passed to a regeneration circuit. The regenerated signal is compared with the equalized signal to generate a difference signal, again fed back to the equalizer. The sliced signal is also fed to a clock recovery circuit which recovers the clock signal embedded in the received signal. The two modes can be combined to provide an optimal method for the restoration of a drooped signal.

An advantage of the present invention is that it provides methods and circuits for restoring a drooped signal.

Another advantage of the present invention is that it provides methods and circuits asynchronous restoration of a drooped signal.

Yet another advantage of the present invention is that it provides methods and circuits synchronous restoration of a drooped signal.

Still another advantage of the present invention is that it provides methods and circuits for restoration of a drooped signal using both asynchronous and synchronous methods.

These and other features and advantages of the present invention will become well understood upon examining the figures and reading the following detailed description of the invention.

IN THE DRAWINGS

DETAILED DESCRIPTION OF THE PREFERRED EMBODIMENTS

Figure 1A:
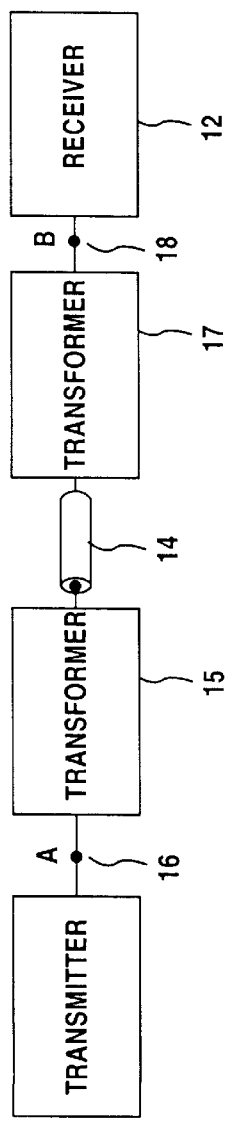
FIG. 1a illustrates a prior art transmission system having a transmitter, a long cable, and a receiver.
Figure 1B:
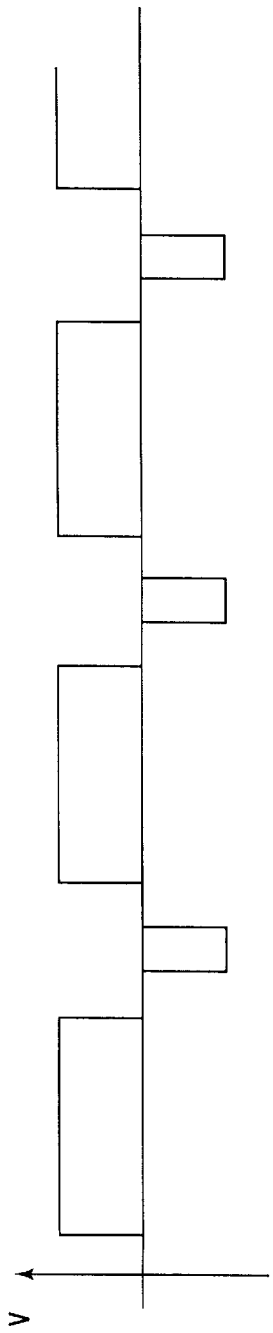
FIG. 1b illustrates a proper DC signal with no drooping.
Figure 1C:
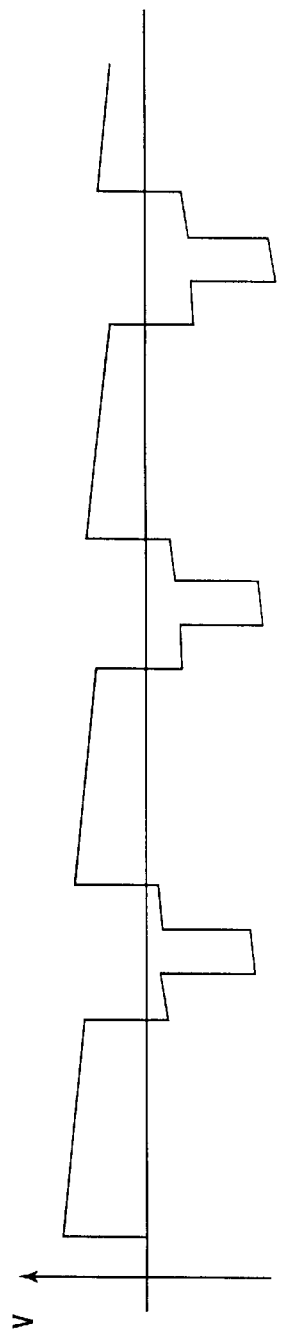
FIG. 1c illustrates a drooped DC signal.
Figure 2:
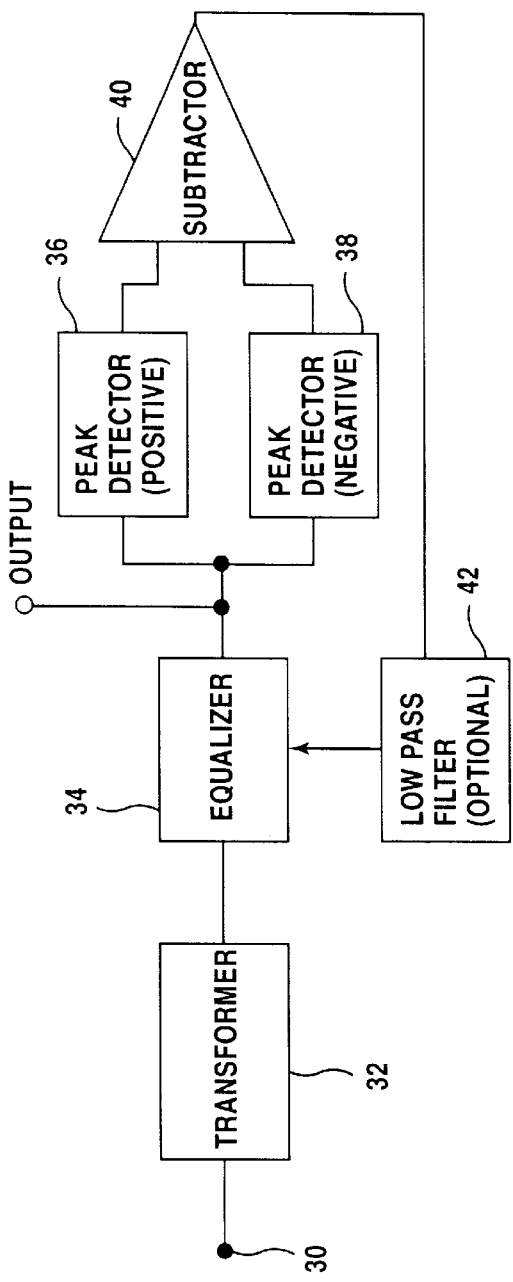
FIG. 2 illustrates a circuit for restoring a drooped DC signal asynchronously.

In a presently preferred embodiments of the present invention, referring to FIG. 2, an embodiment of the asynchronous restoration circuit is illustrated. Here, the transformer 32 isolates the DC component of the received signal, and the received signal is DC shifted to match the required DC level of the equalizer 34. The equalizer compensates the received signal according to the amount of attenuation. The equalized signal, which is also the output signal for this circuit, is provided to two peak detectors, 36 and 38. One peak detect 36 continuously detects the positive peak of the equalized signal and the other peak detector 38 detects the peak of the signal inverted. The difference between the two peaks are then generated by a subtrator 40 and fed back to the equalizer 34 via a low pass filter 42. The low pass filter reduces noise and is an optional block here. The difference between the two peaks translates into a difference signal. When the filtered difference signal is fed back to the equalizer 34, the equalizer can add it to the just received signal path and thus correct drooping. The resulting output from the equalizer 34 thus are better corrected for drooping.

Figure 3:
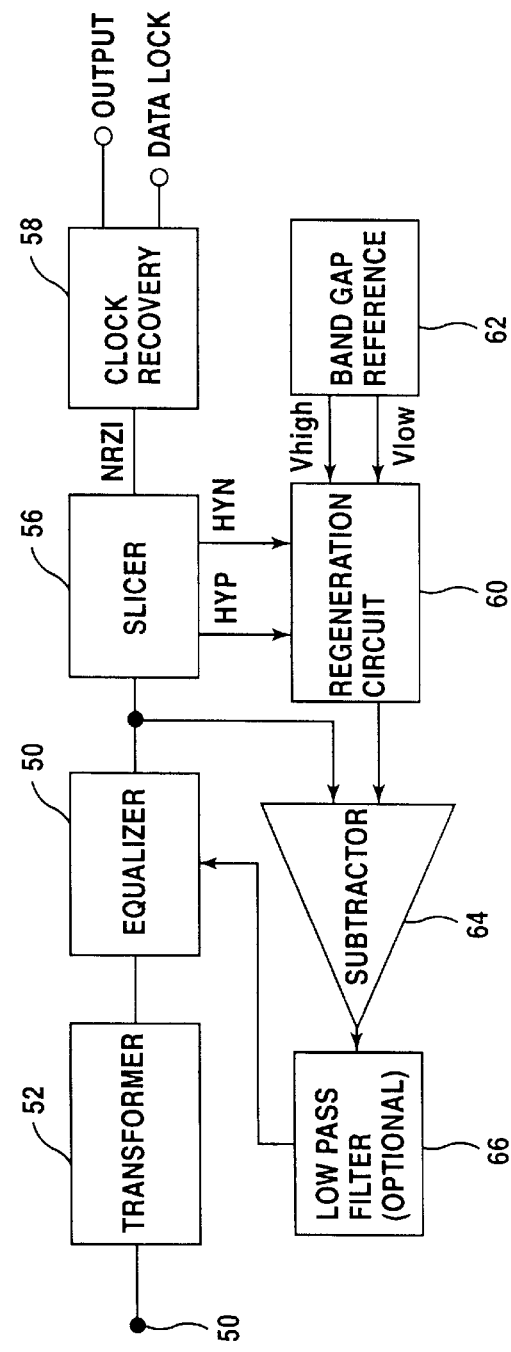
FIG. 3 illustrates a circuit for restoring a drooped DC signal synchronously.
Figure 4A:
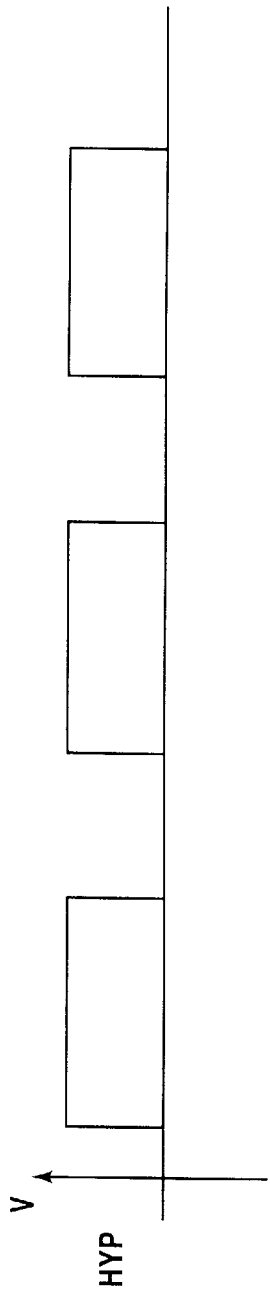
FIG. 4a illustrates the HYP signal which is the positive portion of the equalized signal.
Figure 4B:
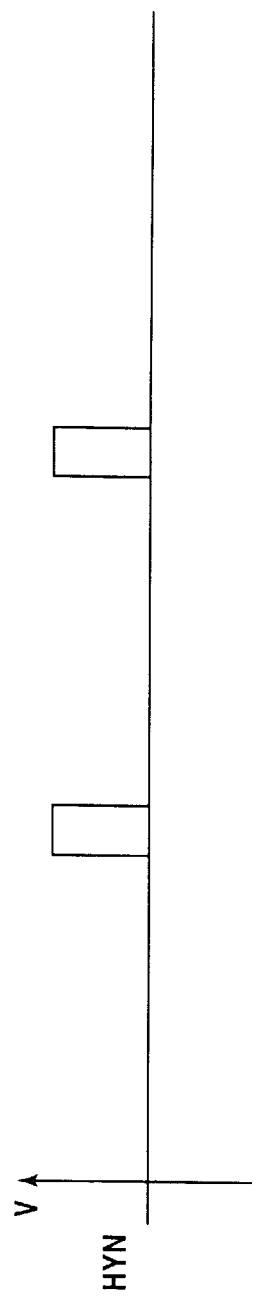
FIG. 4b illustrates the HYN signal which is the inverted negative portion of the equalized signal.
Figure 4C:
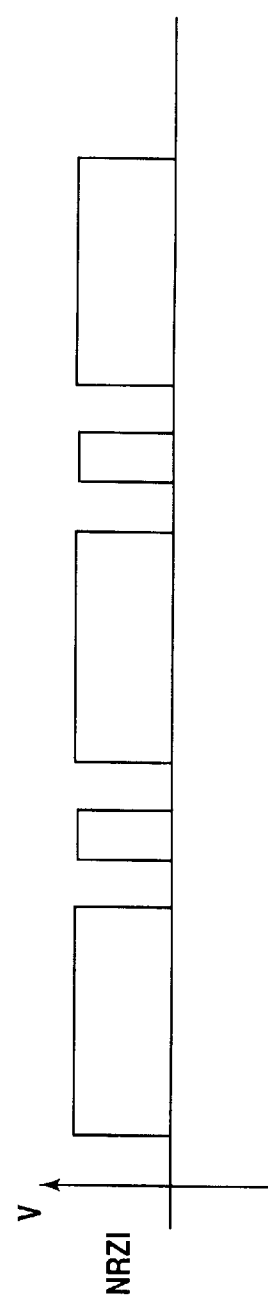
FIG. 4c illustrates a NRZI signal, which is the combined positive and inverted negative portions of the equalized signal.

Referring to FIG. 3, in synchronous mode, the drooped signal again is level shifted after a transformer 52 and equalized 54. A slicer 56 separates out the positive portion of the equalized signal (HYP signal) and the negative portion of the equalized signal (HPN signal). FIGS. 4a and 4b illustrate examples of the HYP and HYN signals. The slicer also generates a NRZI signal which is the sum of the HYP and HYN signals. FIG. 4c illustrates the NRZI signal. The NRZI signal is provided to the clock recovery circuit 58. The clock recovery circuit adjusts the NRZI signal for phase shift and attempts to lock the signal. Since the clock signal is of a known pattern, the NRZI signal is adjusted accordingly and provided as the output for this circuit. The clock recovery circuit also provides a data lock signal to indicate whether the clock/data is locked or not.

The HYP and HYN signals are provided to a regeneration circuit. Since the expected voltage levels of the drooped signal is predefined, the band gap reference circuit 62 provides the expected and predefined Vhigh and Vlow signals to the regeneration circuit 60. The regeneration circuit 60 receiving the HYN and HYP signals and the Vhigh and Vlow signals, generates a copy of the equalized signal except it is without drooping. The regenerated signal is compared against the equalized signal via a subtractor 64. The subtractor 64 generates a difference signal and this signal is again low pass filtered and passed to the equalizer 54. The equalizer 54 adds the difference signal to its signal path and outputs an equalized signal corrected for drooping.

Figure 5:
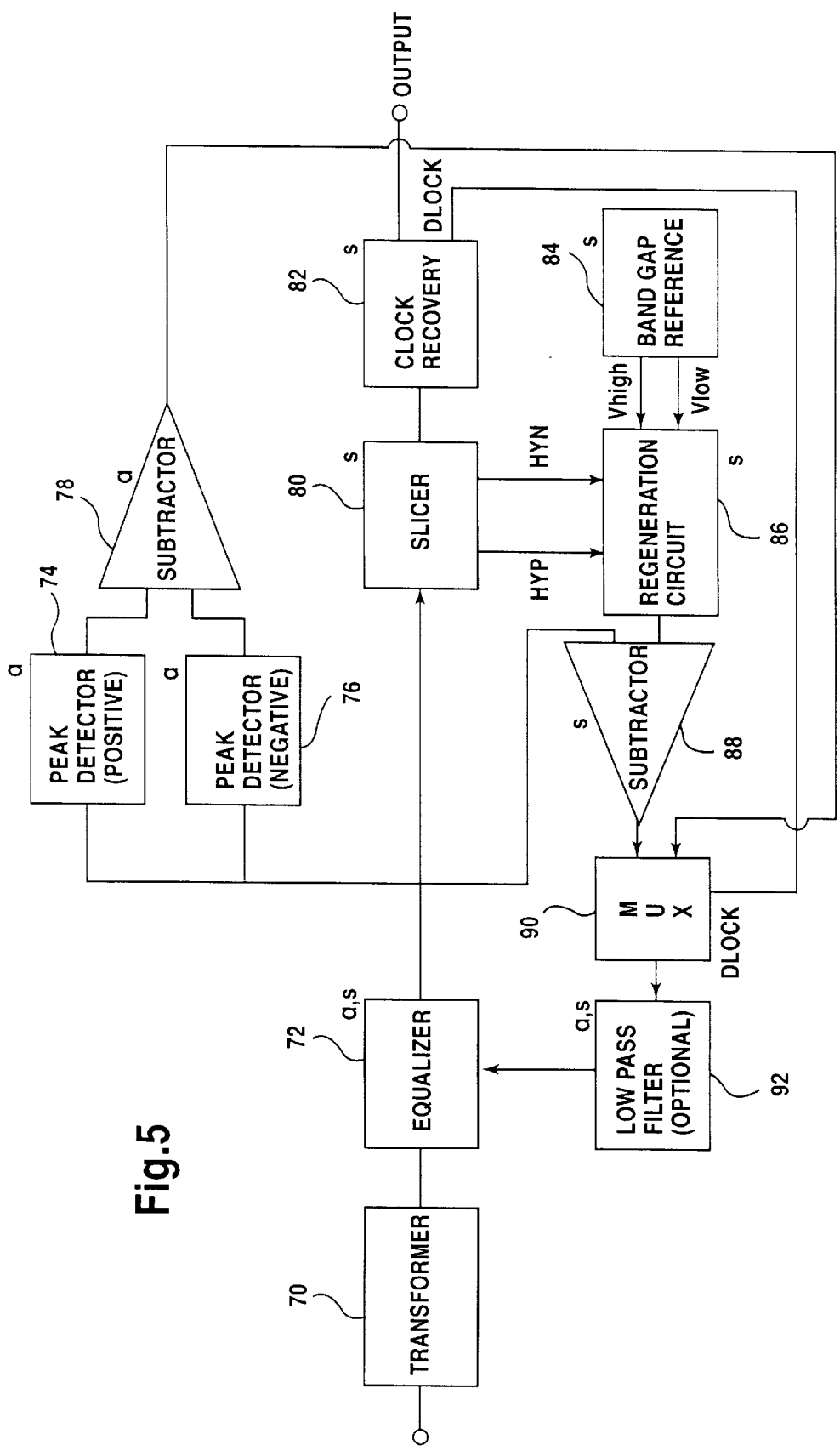
FIG. 5 illustrates a circuit combining both the synchronous and asynchronous circuits for the restoration of a drooped signal.

In yet another embodiment of the present invention, referring to FIG. 5, the two circuits illustrated in FIGS. 2 and 3 are combined into a single circuit to generate the best result. Here, the combined circuit operates in two stages. Typically during the first stage, adaptation is not complete and the data after the slicer is not correct or useful. The data lock signal (DLOCK) from the clock recovery circuit 82 indicates that the clock/data is not locked and drooping should be corrected by asynchronous mode. The DLOCK signal causes the multiplexer 90 to select the output from the asynchronous portion of the circuit (from substrator 78). Once adaptation is completed and the data is locked, the clock recovery circuit 82 asserts the DLOCK signal to cause the multiplexer 90 to select the output from subtractor 88, which is the output from the synchronous portion of this circuit, resulting in a better corrected DC signal.

While the present invention has been described with reference to certain preferred embodiments, it is to be understood that the present invention is not to be limited to such specific embodiments. Rather, it is the inventor's intention that the invention be understood and construed in its broadest meaning as reflected by the following claims. Thus, these claims are to be understood as incorporating and not only the preferred embodiment described herein but all those other and further alterations and modifications as would be apparent to those of ordinary skill in the art.

What we claim are:

1. A circuit for correcting a drooped DC signal, said circuit comprising:

an asynchronous drooping correcting subcircuit, receiving said drooped DC signal and outputting a first corrected signal;

a synchronous drooping correcting subcircuit, receiving said drooped DC signal and outputting a second corrected signal;

a multiplexer, receiving said first corrected signal and said second corrected signal;

data lock signal generating means generating a data lock signal, supplied to the multiplexer, wherein said multiplexer selects said first corrected signal or said second corrected signal based on the data lock signal; and an equalizer, receiving said drooped DC signal and a signal selected by said multiplexer and outputting an output corrected signal which is a sum of the received signals.

2. A circuit for correcting a drooped DC signal according to claim 1, wherein said asynchronous drooping correcting subcircuit determines a difference between a peak positive amplitude of said drooped DC signal and a peak negative amplitude of said drooped DC signal and said first corrected signal is proportional to said difference.

3. A circuit for correcting a drooped DC signal according to claim 1, wherein said synchronous drooping correcting subcircuit comprises:

a slicer, which receives said drooped DC signal, separates negative and positive equalized portions of said drooped DC signal, generates a NRZI signal based on a sum of said negative and positive equalized portions, outputs said NRZI signal to said data lock signal generating means, and outputs said negative and positive equalized portions;

a regeneration circuit, which receives said negative and positive equalized portions and generates a regenerated signal based on predetermined signals supplied by a band gap reference circuit; and a substractor, receiving said regenerated signal and said drooped DC signal and producing a difference signal proportional to the difference between said regenerated signal and said drooped DC signal;

wherein said second corrected signal is said difference signal.

* * * * *